United States Patent
Wise et al.

(10) Patent No.: US 7,443,007 B2
(45) Date of Patent: Oct. 28, 2008

(54) TRENCH ISOLATION STRUCTURE HAVING AN IMPLANTED BUFFER LAYER

(75) Inventors: Rick L. Wise, Fairview, TX (US); Mark S. Rodder, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 92 days.

(21) Appl. No.: 11/564,634

(22) Filed: Nov. 29, 2006

(65) Prior Publication Data

US 2007/0085164 A1    Apr. 19, 2007

Related U.S. Application Data

(62) Division of application No. 10/870,016, filed on Jun. 17, 2004, now Pat. No. 7,160,782.

(51) Int. Cl.
*H01L 23/58* (2006.01)

(52) U.S. Cl. .............................. 257/519; 257/E21.551; 438/433

(58) Field of Classification Search ............... 257/519; 438/431
See application file for complete search history.

(56) References Cited

U.S. PATENT DOCUMENTS

| | | | |
|---|---|---|---|
| 5,880,020 A | 3/1999 | Mano | |
| 5,915,195 A | 6/1999 | Fulford et al. | |
| 6,274,455 B1 | 8/2001 | Seo | |
| 6,576,558 B1 | 6/2003 | Lin et al. | |
| 2002/0060320 A1 * | 5/2002 | Iwamatsu et al. | 257/51 |
| 2003/0049893 A1 | 3/2003 | Currie et al. | |
| 2004/0212035 A1 | 10/2004 | Yeo et al. | |

* cited by examiner

*Primary Examiner*—Stephen W Smoot
(74) *Attorney, Agent, or Firm*—Wade J. Brady, III; Frederick J. Telecky, Jr.

(57) ABSTRACT

The present invention provides a trench isolation structure, a method of manufacture therefor and a method for manufacturing an integrated circuit including the same. The trench isolation structure (130), in one embodiment, includes a trench located within a substrate (110), the trench having an implanted buffer layer (133) located in the sidewalls thereof. The trench isolation structure (130) further includes a barrier layer (135) located over the implanted buffer layer (133), and fill material (138) located over the barrier layer (135) and substantially filling the trench.

8 Claims, 4 Drawing Sheets

TRENCH ISOLATION STRUCTURE HAVING AN IMPLANTED BUFFER LAYER

This application is a divisional of application Ser. No. 10/870,016, filed Jun. 17, 2004, now U.S. Pat. No. 7,160,782, issued Jan. 9, 2007.

TECHNICAL FIELD OF THE INVENTION

The present invention is directed, in general, to a trench isolation structure and, more specifically, to a trench isolation structure having an implanted buffer layer located along sidewalls of the trench, a method of manufacture therefor, and a method for manufacturing an integrated circuit including the same.

BACKGROUND OF THE INVENTION

An important aim of ongoing research in the semiconductor industry is increasing semiconductor performance while decreasing the size of semiconductor devices. One known step the industry has taken to attain this increased semiconductor performance is to implement strained silicon technology. Fortunately, strained silicon technology allows for the formation of higher speed devices.

Strained-silicon transistors may be created a number of different ways, including by introducing a dislocation loop, or excess plane of atoms, into a crystalline material. In one instance strained layers are created by forming a layer of silicon germanium (SiGe) below a silicon epitaxial layer. The average distance between atoms in the SiGe crystal lattice is greater than the average distance between atoms in an ordinary silicon lattice. Because there is a natural tendency of atoms inside different crystals to align with one another when a second crystal is formed over a first crystal, when silicon is deposited on top of SiGe, or vice-versa, the silicon crystal lattice tends to stretch or "strain" to align the silicon atoms with the atoms in the SiGe layer. Fortunately, as the electrons in the strained silicon experience less resistance and flow up to 80% faster than in unstrained silicon, the introduction of the strained silicon layer allows for the formation of higher speed devices. Problems currently exist, however, with the integration of the strained silicon technology with preexisting technologies.

Accordingly, what is needed in the art is a semiconductor device and method of manufacture therefore that experiences the benefits of strained silicon technology without experiencing its drawbacks.

SUMMARY OF THE INVENTION

To address the above-discussed deficiencies of the prior art, the present invention provides a trench isolation structure, a method of manufacture therefor and a method for manufacturing an integrated circuit including the same. The trench isolation structure, in one embodiment, includes a trench located within a substrate, the trench having an implanted buffer layer located on the sidewalls thereof. The trench isolation structure further includes a barrier layer located over the implanted buffer layer, and fill material located over the barrier layer and substantially filling the trench.

As indicated above, the present invention further provides a method for manufacturing a trench isolation structure. The method for manufacturing a trench isolation structure, among other steps, includes forming a trench in a substrate, implanting a buffer layer in the sidewalls of the trench, forming a barrier layer over the implanted buffer layer, and forming fill material over the barrier layer to substantially fill the trench.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Strained silicon technology, and more specifically, strained silicon technology employing silicon germanium (SiGe) as the strain inducing layer, is well known and commonly used in today's high technology fields. Unfortunately, as initially recognized by the present invention, compatibility issues arise when the strained silicon technology employing SiGe is integrated with conventional trench isolation structures. The present invention, in contrast to the prior art, recognizes that at least a portion of the compatibility issues can be attributed to undesirable effects occurring at the interface between the SiGe layer and the barrier layer lining the sidewalls of the trench isolation structures. Particularly, it has been observed that the growth of the barrier layer at this interface causes the germanium at the interface to pile up. Substantial experimentation indicates that the germanium pile up causes device problems (e.g., edge diode leakage issues), becoming more pronounced as the width of the transistors continues to decrease.

Given the aforementioned recognition, one inventive aspect of the present invention is the realization that a buffer layer may be employed between the SiGe layer located along the sidewalls of the trench and the barrier layer to provide a sufficient cushion between the SiGe layer and barrier layer so as to substantially reduce, or even eliminate, the germanium pile up. Therefore, the buffer layer may be introduced into the manufacture of the trench isolation structures to reduce the aforementioned integration issues associated with the strained silicon technology.

Figure 1:
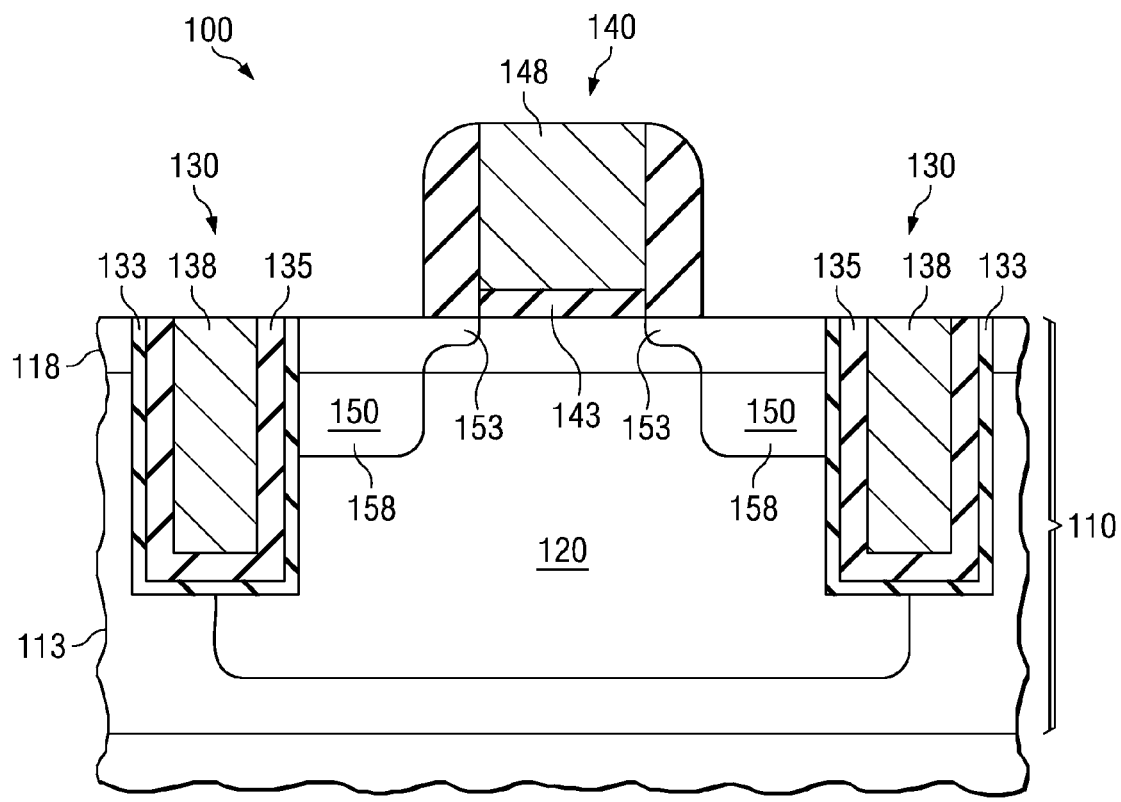
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention, which benefits from the unique recognition discussed above. In the embodiment illustrated in FIG. 1, the semiconductor device 100 includes a substrate 110. The substrate 110, as illustrated, may comprise any combination of one or more layers. The particular embodiment of FIG. 1, however, illustrates the substrate 110 including a first substrate portion 113 comprising SiGe and a second substrate portion 118 comprising strained silicon.

Located within the substrate 110 in the embodiment of FIG. 1 is a well region 120. Located within the substrate 110, and in this embodiment partially overlapping the well region 120, are novel trench isolation structures 130. The novel trench isolation structures 130 each include an implanted buffer layer 133 located in the sidewalls of the trench. The implanted buffer layer 133, which may comprise implanted silicon having a peak concentration ranging from about 5E21 atoms/cm$^3$ to about 2E22 atoms/cm$^3$ in an exemplary embodiment, may also be located in a bottom surface of the trench. If the implanted buffer layer 133 remains after formation of the barrier layer 135, it might have a maximum depth into the sidewall of about 25 nm. Preferably, the implanted buffer layer 133 would have a maximum depth into the sidewall of about 10 nm, and optimally would have a depth into the sidewall, if still present at all, ranging from about 2 nm to about 10 nm.

Formed over, and in this particular embodiment directly on the implanted buffer layer 133, is a barrier layer 135. The barrier layer 135, among other materials, may comprise an oxide, such as silicon dioxide. Similarly, the barrier layer 135 may have a thickness, among others, ranging from about 4 nm to about 20 nm. While the embodiment of FIG. 1 illustrates that the barrier layer 135 be located over the implanted buffer layer 133, and more particularly in between the implanted buffer layer 133 and the fill material 138, such is not always the case. It is believed that in certain embodiments the barrier layer 135 may be dispensed with, the implanted buffer layer 133 providing the requisite buffer between the trench surface and the fill material 138. In this instance the implanted buffer layer 133 would retard the formation of germanium pile-up, as might be the case were the fill material 138 to be formed directly on the trench surfaces.

Additionally located over the barrier layer 135, and substantially filling the trench of the trench isolation structure 130, is fill material 138. The fill material 138 may comprise a multitude of different materials while staying within the scope of the present invention.

As illustrated in FIG. 1, additionally located over the substrate 110 and well region 120, and between the trench isolation structures 130, is a gate structure 140. The gate structure 140 illustrated in FIG. 1 includes a conventional gate dielectric 143 located over the substrate 110, as well as a conventional gate electrode 148 located over the gate dielectric 143. The semiconductor device 100 additionally includes conventional source/drain regions 150 located within the substrate 110 and proximate the gate dielectric 143. The source/drain regions 150, as is common, may each include an extension portion 153 as well as a source/drain portion 158. While the semiconductor device 100 illustrated in FIG. 1 includes only a limited number of features, those skilled in the art understand that the semiconductor may, and in most instances will, contain a multitude of other features while staying within the scope of the present invention.

Figure 2:
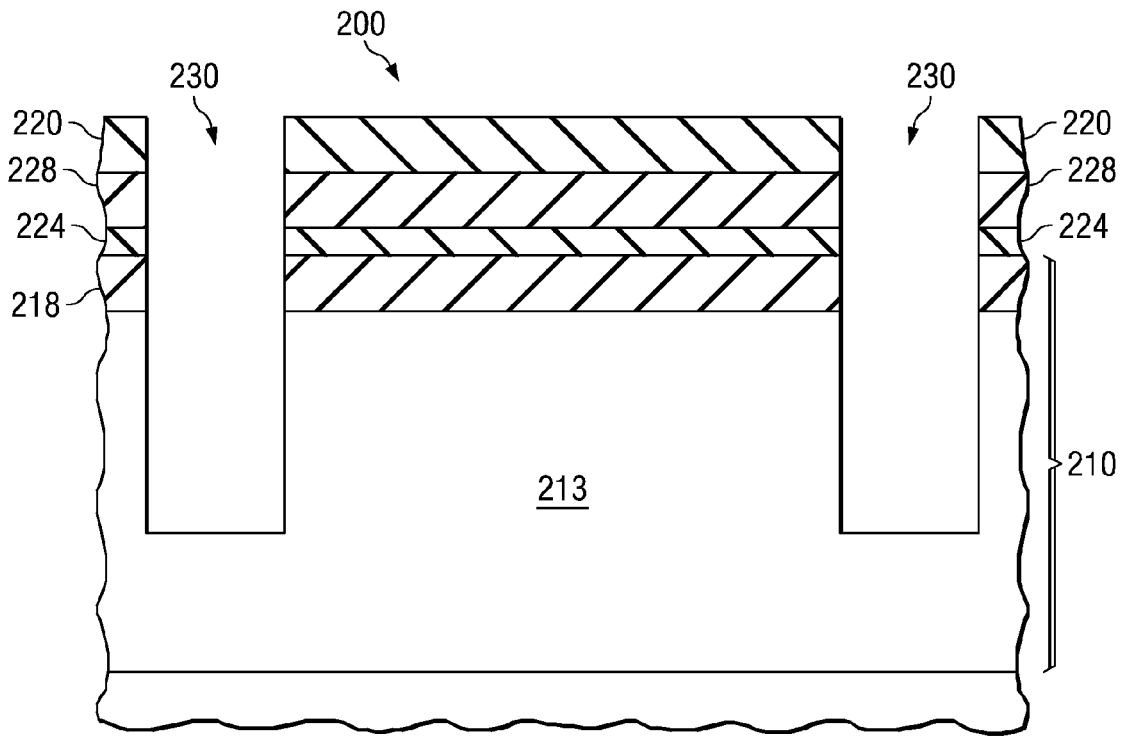
FIG. 2 illustrates a cross-sectional view of a partially completed semiconductor device manufactured in accordance with the principles of the present invention.

Turning now to FIGS. 2-5, illustrated are cross-sectional views of detailed manufacturing steps instructing how to, in an advantageous embodiment, manufacture a semiconductor device similar to the semiconductor device 100 depicted in FIG. 1. FIG. 2 illustrates a cross-sectional view of a partially completed semiconductor device 200 manufactured in accordance with the principles of the present invention. The partially completed semiconductor device 200 of FIG. 2 initially includes a substrate 210. The substrate 210 may, in an exemplary embodiment, be any layer located in the partially completed semiconductor device 200, including a wafer itself or a layer located above the wafer (e.g., epitaxial layer). Similarly, the substrate 210 may comprise one or more layers while staying within the scope of the present invention.

In the embodiment illustrated in FIG. 2, the substrate 210 includes a first substrate portion 213 comprising SiGe and a second substrate portion 218 comprising strained silicon. It has been observed that many of the novel aspects of the present invention are particularly useful when used in conjunction with the aforementioned first and second substrate portions 213, 218. Those skilled in the art understand many of the specific processing steps that might be used to form the illustrative first and second substrate portions 213, 218, therefore, no further detail will be given at this time. Even though the exemplary embodiment of FIGS. 2-5 has been discussed with respect to the first and second substrate portions 213, 218, comprising SiGe and strained silicon, respectively, other materials could be used for the substrate 210.

The substrate 210 of FIGS. 2-5 is a P-type substrate; however, one skilled in the art understands that the substrate 210 could be an N-type substrate without departing from the scope of the present invention. In such a case, each of the dopant types described throughout the remainder of this document would be reversed. For clarity, no further reference to this opposite scheme will be discussed.

Conventionally formed within the substrate 210 using a patterned resist layer 220 and an optional dielectric stack (e.g., oxide layer 224 and nitride layer 228), are trenches 230. An exemplary lithographic process has been used to form the trenches 230 in the substrate 210. Lithography refers to a process for pattern transfer between various media. The lithographic process may include forming a radiation sensitive resist coating over the layer to be patterned, in this case the substrate 210. The radiation sensitive resist coating may then be patterned by selectively exposing the resist through a mask. In turn, the exposed areas of the coating become either more or less soluble than the unexposed areas, depending on the type of resist. A solvent developer may then be used to remove the less soluble areas leaving the patterned resist layer 220.

After the resist layer 220 is patterned, the dielectric layer stack, comprising the oxide layer 224 and the nitride layer 228, and substrate 210 may be etched using the patterned resist layer 220 as a mask to transfer the pattern to the substrate 210. Etch processes, among others, might include plasma etching, reactive ion etching, wet etching, or combinations thereof. Nevertheless, plasma etching is preferred.

The resulting trenches 230, in an advantageous embodiment, have a depth ranging from about 0.2 µm to about 0.5 µm and a width ranging from about 0.1 µm to about 0.5 µm. Other depths and widths may nonetheless be used.

Figure 3:
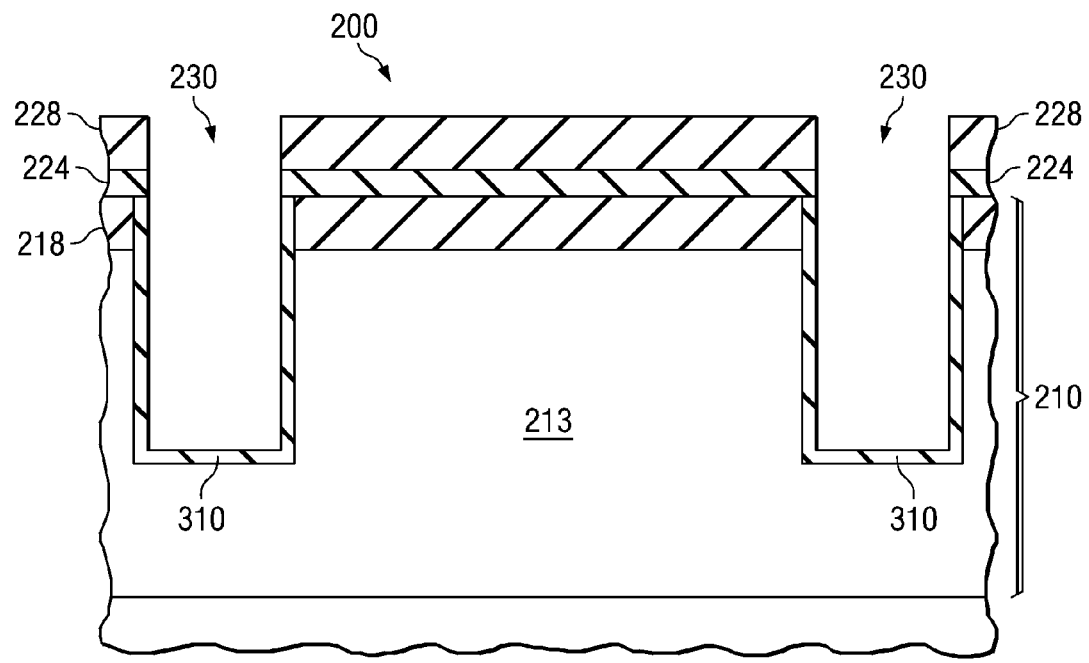
FIG. 3 illustrates a cross-sectional view of the partially completed semiconductor device illustrated in FIG. 2 after implanting a buffer layer in the sidewalls of the trenches.

Turning now to FIG. 3, illustrated is a cross-sectional view of the partially completed semiconductor device 200 illustrated in FIG. 2 after removing the resist layer 220 and implanting a buffer layer 310 into the sidewalls of the trenches 230. As illustrated, the implanted buffer layer 310 may also advantageously be formed in the bottom surface of the trenches 230, and forms an interface with the substrate 210.

Figure 4:
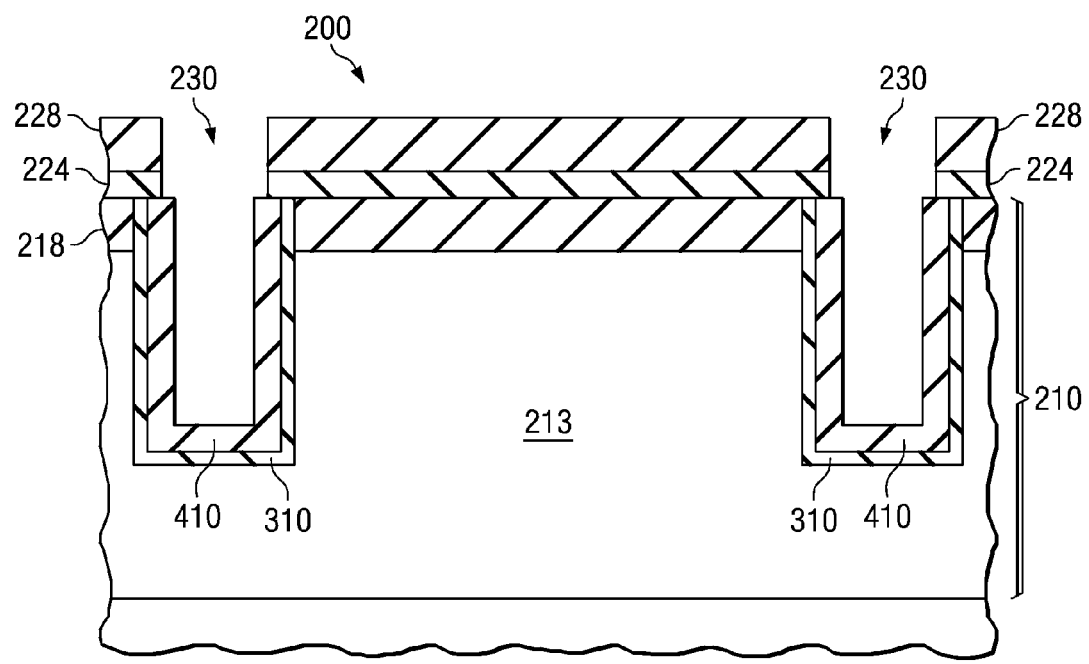
FIG. 4 illustrates a cross-sectional view of the partially completed semiconductor device illustrated in FIG. 3 after forming a barrier layer over the implanted buffer layer.

The depth of the implanted buffer layer 310 into the substrate 210 is at least partially dependent on the thickness of the barrier layer 410 that will be formed thereover (FIG. 4). For instance, the implanted buffer layer 310 in an exemplary embodiment should initially be formed to a depth of approximately half the thickness of the resulting barrier layer 410 (FIG. 4). Accordingly, in an advantageous embodiment, the peak portion of the implanted buffer layer 310 may be implanted to a depth up to about 25 nm, and more particularly a depth ranging from about 2 nm to about 10 nm, and even more optimally a depth ranging from about 2 nm to about 5 nm. The implanted buffer layer 310 may further comprise a number of different materials while staying within the scope of the present invention. In the illustrative embodiment, however, the implanted buffer layer 310 comprises implanted silicon. Other implanted buffer layers 310 could nonetheless be used.

The implanted buffer layer 310 may be formed using many different implantation processes. For example, the embodiment of FIG. 3 illustrates the implanted buffer layer 310 being implanted into the sidewalls and bottom surface of the trenches 230 using a conventional ion implantation process. As the dielectric stack comprising the oxide layer 224 and nitride layer 228 remains on the substrate 210 at this time, the implanted buffer layer 310 does not form in the upper surface of the substrate 210 in the embodiment shown.

In the embodiment where the implanted buffer layer 310 is implanted using the ion implantation process, a dose of about 1E15 atoms/cm$^2$ to about 1E16 atoms/cm$^2$ silicon ions using an ion implantation energy of 5-15 keV may be used. $SiF_4$ may be used for the silicon source. The ion beam may be directed about 1 to about 7 degrees off normal to the wafer surface and four equal dose implants (quad implants) may be used with the wafer rotated 90 degrees between each implant. Alternatively, plasma immersion ion implant doping techniques may be used to conformally introduce high levels of silicon atoms into the trench sidewall surfaces. It goes without saying that other implantation parameters and techniques are equally as applicable to the present invention. The temperatures used to form the implanted buffer layer 310, as well as subsequent layers, may cause a portion of the germanium from the first substrate portion 213 to diffuse into the implanted buffer layer 310. As the concentration of germanium within the implanted buffer layer 310 is minimal, it should not cause any significant problems.

Turning now to FIG. 4, illustrated is a cross-sectional view of the partially completed semiconductor device 200 illustrated in FIG. 3 after forming a barrier layer 410 over the implanted buffer layer 310. While not shown, the barrier layer 410 may comprise any combination of one or more layers. In the illustrative embodiment shown, the barrier layer 410 is located on the implanted buffer layer 310. Nevertheless, the implanted buffer layer 310 might not always remain on the sidewalls and bottom surfaces of the trenches 230, as the barrier layer 410 might consume the entire implanted buffer layer 310 during its formation. In this instance the barrier layer 410 might be located over, and more particularly directly on, the sidewalls and bottom surface of the trenches 230. Nevertheless, the embodiment of FIG. 4 has a thin implanted buffer layer 310 remaining on the sidewalls and bottom surfaces of the trenches 230. In an ideal situation the remaining implanted buffer layer 310 should have a depth ranging from about 2 nm to about 5 nm into the substrate 210.

The barrier layer 410 advantageously has a thickness ranging from about 4 nm to about 20 nm, and more particularly a thickness ranging from about 5 nm to about 10 nm. Similarly, the barrier layer 410 ideally comprises silicon dioxide. Other materials, including a nitrided oxide, could also be used for the barrier layer 410.

The barrier layer 410 may be formed using a number of different processes. For instance, the particular process used might depend on the material chosen for the implanted buffer layer 310. In the illustrative embodiment of FIGS. 3-4 the implanted buffer layer 310 comprises a layer of silicon. Thus, in this exemplary embodiment, a thermal oxidation process might be used to form the barrier layer 410. If a thermal oxidation process were used, the partially completed semiconductor device 200 could be subjected to a temperature of less than about 850° C. in the presence of oxygen for a time period ranging from about 20 minutes to about 60 minutes to form the barrier layer 410. Obviously the oxidation temperature and time could be optimized to provide a particular barrier layer 410 thickness or quality. Those skilled in the thermal growth of oxides would understand how to tailor these process parameters. Even though the formation of the barrier layer 410 is discussed with respect to a thermal growth process, any known or later discovered deposition process could also be used.

Figure 5:
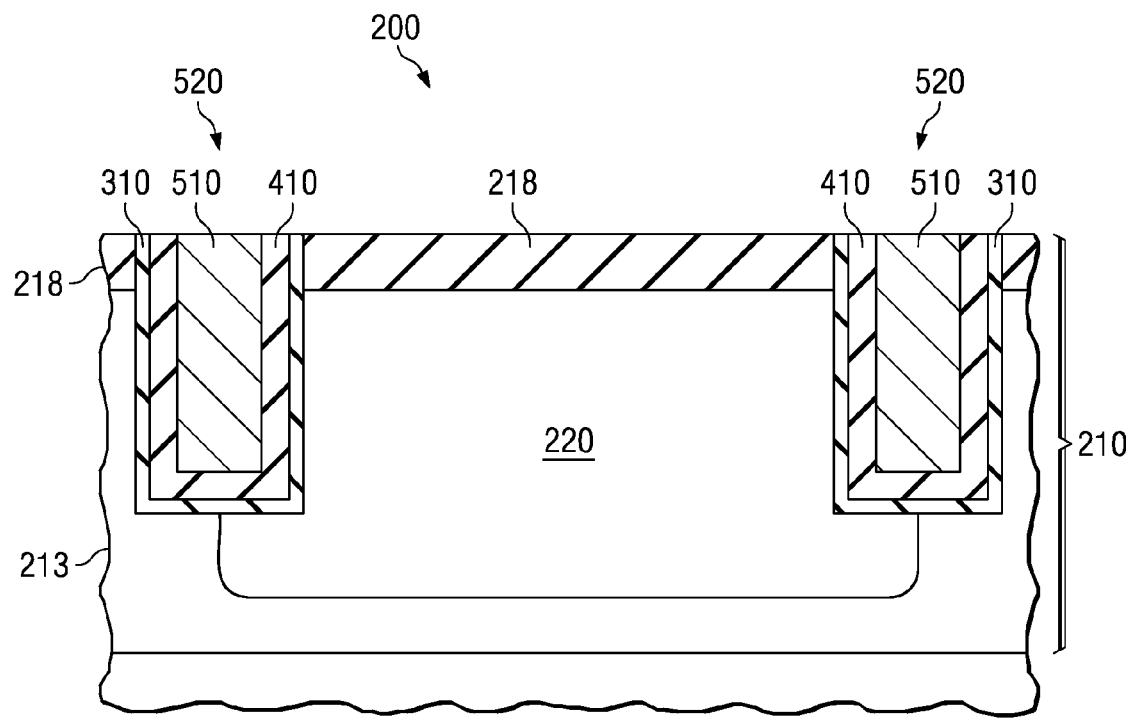
FIG. 5 illustrates a cross-sectional view of the partially completed semiconductor device illustrated in FIG. 4 after depositing a blanket layer of fill material over the substrate and within the trenches, and subsequent thereto polishing the blanket layer of fill material resulting in fill material plugs.

Turning now to FIG. 5, illustrated is a cross-sectional view of the partially completed semiconductor device 200 illustrated in FIG. 4 after depositing a blanket layer of fill material over the substrate 210, dielectric stack (e.g., the oxide layer 224 and nitride layer 228), and within the trenches 230, and subsequent thereto polishing the blanket layer of fill material, and removing the dielectric stack comprising the oxide layer 224 and nitride layer 228, resulting in fill material plugs 510. As is illustrated, the fill material plugs 510 substantially, if not completely, fill the trenches 230.

Those skilled in the art understand the specific processes that could be used to deposit the blanket layer of fill material and polish it back to the substrate 210. For instance, a blanket layer of dielectric material, or in another instance a blanket layer of slightly conductive material, could be CVD deposited in such a way as to substantially fill the trenches 230. Thereafter, a conventional chemical mechanical planarization (CMP) process might be used to polish the undesirable portions of the blanket layer of fill material, undesirable portions of the barrier layer 410 located on the dielectric stack (e.g., the oxide layer 224 and nitride layer 228), undesirable remaining portions of the implanted buffer layer located on the dielectric stack (e.g., the oxide layer 224 and nitride layer 228), and the dielectric stack (e.g., the oxide layer 224 and nitride layer 228) itself back to the substrate 210. Other deposition and polishing processes could also be used.

What results after the blanket deposition and polishing processes are completed trench isolation structures 520. Each of the completed trench isolation structures 520 includes the barrier layer 410 and the fill material plug 510. In certain embodiments of the invention, as discussed above, a portion of the implanted buffer layer 310 remains between the sides and bottom surface of the substrate 210 and the barrier layer 410. This circumstance might occur where the barrier layer 410 does not completely consume the implanted buffer layer 310. This is actually an exemplary embodiment, as the barrier layer 410 does not have a chance to interact with the germanium of the first substrate portion 213, and thus, the germanium pile up is reduced, if not eliminated.

Figure 6:
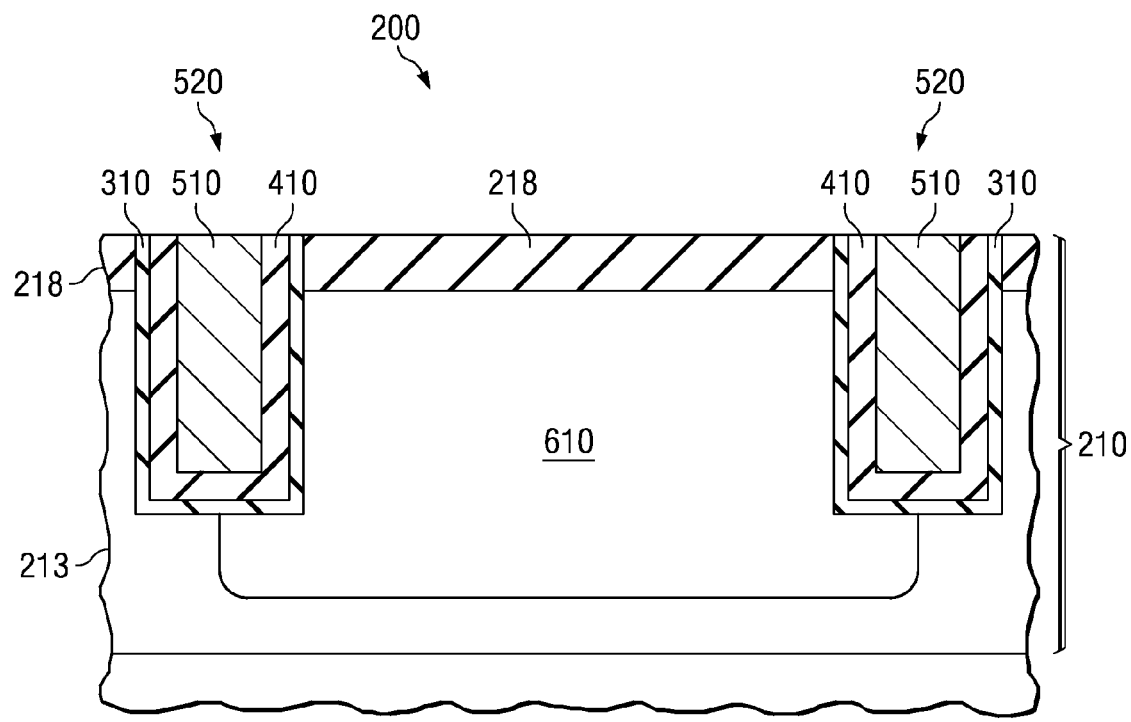
FIG. 6 illustrates a cross-sectional view of the partially completed semiconductor device illustrated in FIG. 5 after forming a well region within the substrate.

Turning now to FIG. 6, illustrated is a cross-sectional view of the partially completed semiconductor device 200 illustrated in FIG. 5 after forming a well region 610 within the substrate 210. The well region 610, in light of the P-type substrate 210, would more than likely contain an N-type dopant. For example, the well region 610 would likely be doped with an N-type dopant dose ranging from about 1E13 atoms/cm$^2$ to about 1E14 atoms/cm$^2$ and at an energy ranging from about 100 keV to about 500 keV. This results in the well region 610 having a peak dopant concentration ranging from about 5E17 atoms/cm$^3$ to about 1E19 atoms/cm$^3$. After completing the well region 610, the semiconductor manufacturing process would continue in a conventional manner until a device somewhat similar to the semiconductor device 100 of FIG. 1 was obtained.

Figure 7:
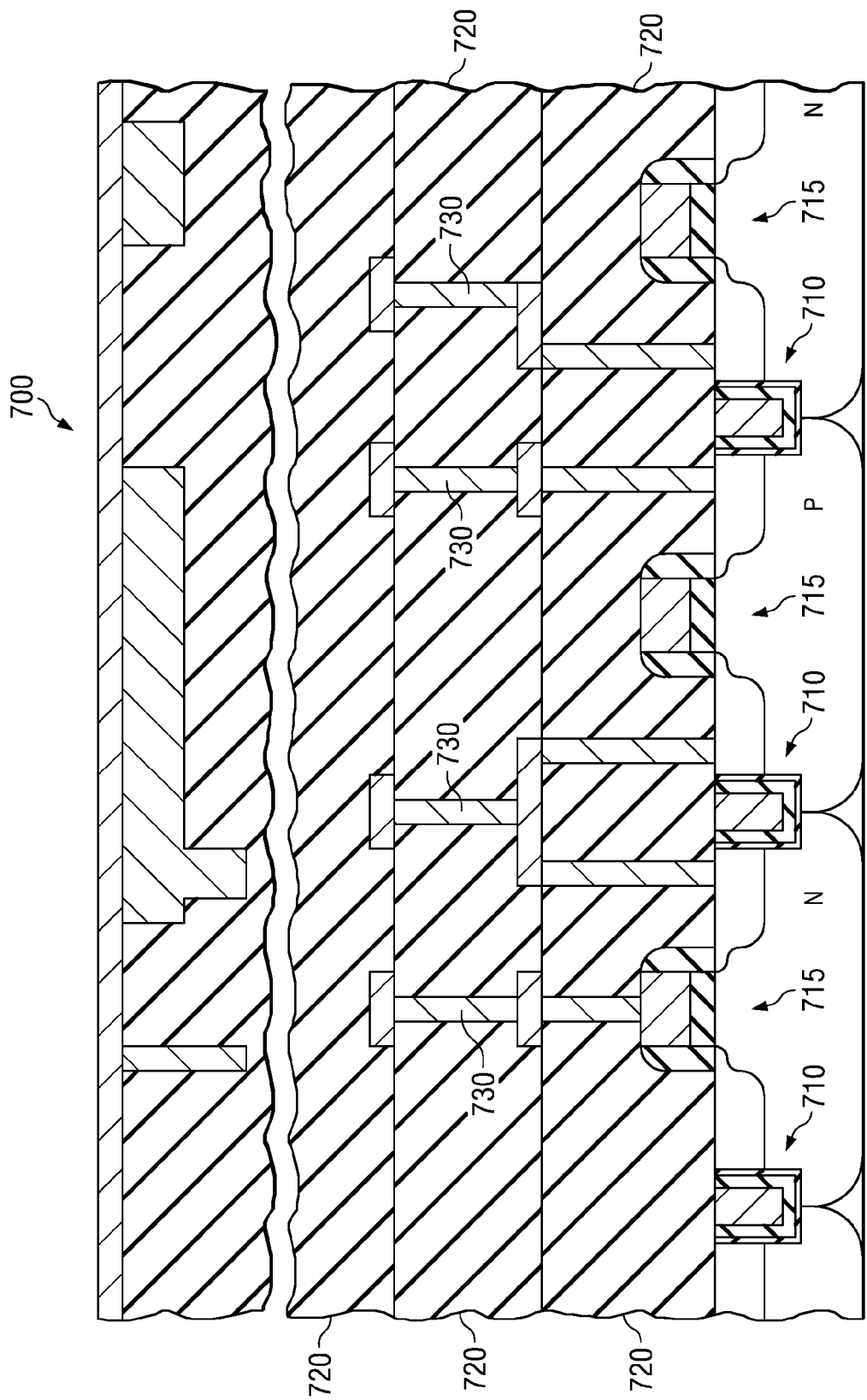
FIG. 7 illustrates a cross-sectional view of a conventional integrated circuit (IC) incorporating the trench isolation structures constructed according to the principles of the present invention.

Referring finally to FIG. 7, illustrated is an exemplary cross-sectional view of an integrated circuit (IC) 700 incorporating trench isolation structures 710 constructed according to the principles of the present invention. The IC 700 may include devices, such as transistors used to form CMOS devices, BiCMOS devices, Bipolar devices, as well as capacitors or other types of devices. The IC 700 may further include passive devices, such as inductors or resistors, or it may also include optical devices or optoelectronic devices. Those skilled in the art are familiar with these various types of devices and their manufacture. In the particular embodiment illustrated in FIG. 7, the IC 700 includes transistor devices 715 located between the trench isolation structures 710. As is illustrated in FIG. 7, dielectric layers 720 may be located over the trench isolation structures 710 and transistor devices 715. Additionally, interconnect structures 730 are located within the dielectric layers 720 to interconnect various devices, thus, forming the operational integrated circuit 700.

Although the present invention has been described in detail, those skilled in the art should understand that they can make various changes, substitutions and alterations herein without departing from the spirit and scope of the invention in its broadest form.

What is claimed is:

1. A trench isolation structure, comprising:
   a substrate having a first substrate portion formed on a silicon germanium portion;
   a trench located within the first substrate portion and the silicon germanium portion, the trench having sidewalls and a bottom surface;
   an implanted buffer layer located in the sidewalls of the trench, wherein the implanted buffer layer includes an implanted first dopant species; and
   fill material located over the implanted buffer layer, the fill material substantially filling the trench.

2. The trench isolation structure as recited in claim 1 further including a barrier layer located between the implanted buffer layer and the fill material.

3. The trench isolation structure as recited in claim 2 wherein the barrier layer has a thickness ranging from about 4 nm to about 20 nm.

4. The trench isolation structure as recited in claim 2 wherein the barrier layer is a silicon dioxide barrier layer located on the implanted buffer layer.

5. The trench isolation structure as recited in claim 1 wherein the implanted first dopant species includes implanted silicon.

6. The trench isolation structure as recited in claim 5 wherein the implanted silicon extends from about 2 nm to about 10 nm into the sidewalls of the trench.

7. The trench isolation structure as recited in claim 5 wherein the implanted buffer layer has a peak implanted silicon concentration ranging from about 5E21 atoms/cm$^3$ to about 2E22 atoms/cm$^3$.

8. The trench isolation structure as recited in claim 1 wherein the implanted buffer layer is further located on the bottom surface.

* * * * *